United States Patent
Akram et al.

(10) Patent No.: US 6,493,934 B2
(45) Date of Patent: Dec. 17, 2002

(54) METHOD FOR SAWING WAFERS EMPLOYING MULTIPLE INDEXING TECHNIQUES FOR MULTIPLE DIE DIMENSIONS

(76) Inventors: Salman Akram, 3713 Gekeler La., Apt. 33, Boise, ID (US) 83706; Derek J. Gochnour, 4540 Pinto Dr., Boise, ID (US) 83709; Michael E. Hess, 19137 S. Pleasant Valley, Kuna, ID (US) 83634; David R. Hembree, 10855 Smoke Ranch Dr., Boise, ID (US) 83709

( * ) Notice: Subject to any disclaimer, the term of this patent is extended or adjusted under 35 U.S.C. 154(b) by 18 days.

(21) Appl. No.: 09/901,838

(22) Filed: Jul. 10, 2001

(65) Prior Publication Data

US 2001/0039728 A1 Nov. 15, 2001

Related U.S. Application Data

(62) Division of application No. 09/567,643, filed on May 9, 2000, which is a division of application No. 09/434,147, filed on Nov. 4, 1999, now Pat. No. 6,196,096, which is a continuation of application No. 09/270,539, filed on Mar. 17, 1999, now Pat. No. 6,155,247, which is a division of application No. 09/069,561, filed on Apr. 29, 1998, now Pat. No. 6,119,675, which is a division of application No. 08/747,299, filed on Nov. 12, 1996, now Pat. No. 6,250,192.

(51) Int. Cl.[7] .................................................. H05K 3/02
(52) U.S. Cl. .............................. 29/847; 29/825; 29/830; 29/846; 83/13
(58) Field of Search .......................... 29/847, 825, 830, 29/846, 829, 834; 83/15; 125/13.01, 23.01, 20

(56) References Cited

U.S. PATENT DOCUMENTS

| | | |
|---|---|---|
| 2,762,954 A | 9/1956 | Leifer |
| 2,865,082 A | 12/1958 | Gates |
| 3,664,389 A | 5/1972 | Bower |
| 3,688,815 A | 9/1972 | Ridenour |
| 3,691,707 A | 9/1972 | Von Arx et al. |
| 3,795,164 A | 3/1974 | Schneider |
| 3,892,156 A | 7/1975 | Johnstone |
| 3,961,547 A | 6/1976 | Shainberg et al. |
| 4,006,656 A | 2/1977 | Shinomiya |
| 4,102,227 A | 7/1978 | Simko |
| 4,138,304 A | 2/1979 | Gantley |
| 4,150,912 A | 4/1979 | Gutsche et al. |
| 4,246,595 A | 1/1981 | Noyori et al. |
| 4,259,886 A | 4/1981 | Seid et al. |
| 4,287,256 A | 9/1981 | Demers |
| 4,287,798 A | 9/1981 | Cooper, Jr. et al. |
| 4,343,662 A | 8/1982 | Gay |
| 4,356,374 A | 10/1982 | Noyori et al. |
| 4,358,978 A | 11/1982 | Lawson |
| 4,451,972 A | 6/1984 | Batinovich |
| 4,513,544 A | 4/1985 | Lossl et al. |
| 4,633,847 A | 1/1987 | Lossl et al. |

(List continued on next page.)

FOREIGN PATENT DOCUMENTS

| | | |
|---|---|---|
| DE | 287869 | 10/1915 |
| DE | 2810054 A | 9/1978 |

Primary Examiner—Carl J. Arbes

(57) ABSTRACT

A semiconductor wafer saw and method of using the same for dicing semiconductor wafers comprising a wafer saw including variable lateral indexing capabilities and multiple blades. The wafer saw, because of its variable indexing capabilities, can dice wafers having a plurality of differently sized semiconductor devices thereon into their respective discrete components. In addition, the wafer saw with its multiple blades, some of which may be independently laterally or vertically movable relative to other blades, can more efficiently dice silicon wafers into individual semiconductor devices.

20 Claims, 9 Drawing Sheets

U.S. PATENT DOCUMENTS

| | | |
|---|---|---|
| 4,688,540 A | 8/1987 | Ono |
| 4,705,016 A | 11/1987 | Sekiya |
| 4,804,641 A | 2/1989 | Arlt et al. |
| 4,903,437 A | 2/1990 | Kubotera et al. |
| 4,937,653 A | 6/1990 | Blonder et al. |
| 4,971,021 A | 11/1990 | Kubotera et al. |
| 5,046,392 A | 9/1991 | Keon et al. |
| 5,059,899 A | 10/1991 | Farnworth et al. |
| 5,128,282 A | 7/1992 | Ormond et al. |
| 5,259,149 A | 11/1993 | Klievoneit et al. |
| 5,316,559 A | 5/1994 | Klievoneit et al. |
| 5,323,150 A | 6/1994 | Tuttle |
| 5,326,428 A | 7/1994 | Farnworth et al. |
| 5,362,681 A | 11/1994 | Roberts, Jr. et al. |
| 5,373,834 A | 12/1994 | Chiuminatta et al. |
| 5,458,034 A | 10/1995 | Cavagna |
| 5,461,008 A | 10/1995 | Sutherland et al. |
| 5,468,541 A | 11/1995 | Hsu |
| 5,521,125 A | 5/1996 | Ormond et al. |
| 5,579,671 A | 12/1996 | Bowlin |
| 5,580,831 A | 12/1996 | Roman |
| 5,851,845 A | 12/1998 | Wood et al. |
| 5,907,984 A | 6/1999 | Herman, Jr. et al. |
| 6,087,202 A | 7/2000 | Exposito et al. |
| 6,117,707 A | 9/2000 | Badehi |
| 6,119,675 A | 9/2000 | Akram et al. |
| 6,130,478 A | 10/2000 | Mostafazadeh et al. |

METHOD FOR SAWING WAFERS EMPLOYING MULTIPLE INDEXING TECHNIQUES FOR MULTIPLE DIE DIMENSIONS

CROSS REFERENCE TO RELATED APPLICATIONS

This application is a divisional of application Ser. No. 09/567,643, filed May 9, 2000, pending, which is a divisional of application Ser. No. 09/434,147, filed Nov. 4, 1999, now U.S. Pat. No. 6,196,096 B1, issued Mar. 6, 2001, which is a continuation of application Ser. No. 09/270,539, filed Mar. 17, 1999, now U.S. Pat. No. 6,155,247, which is a divisional of application Ser. No. 09/069,561, filed Apr. 29, 1998, now U.S. Pat. No. 6,119,675, which is a divisional of application Ser. No. 08/747,299, filed Nov. 12, 1996, now U.S. Pat. No. 6,250,192 B1, issued Jun. 26, 2001.

BACKGROUND OF THE INVENTION

1. Field of the Invention

This invention relates generally to a method and apparatus for sawing semiconductor substrates such as wafers and, more specifically, to a wafer saw and method of using the same employing multiple indexing techniques and multiple blades for more efficient sawing and for sawing multiple die sizes and shapes from a single semiconductor wafer.

2. State of the Art

An individual integrated circuit or chip is usually formed from a larger structure known as a semiconductor wafer, which is usually comprised primarily of silicon, although other materials such as gallium arsenide and indium phosphide are also sometimes used. Each semiconductor wafer has a plurality of integrated circuits arranged in rows and columns with the periphery of each integrated circuit being rectangular. Typically, the wafer is sawn or "diced" into rectangularly shaped discrete integrated circuits along two mutually perpendicular sets of parallel lines or streets lying between each of the rows and columns thereof. Hence, the separated or singulated integrated circuits are commonly referred to as dice.

One exemplary wafer saw includes a rotating dicing blade mounted to an aluminum hub and attached to a rotating spindle, the spindle being connected to a motor. Cutting action of the blade may be effected by diamond particles bonded thereto, or a traditional "toothed" type blade may be employed. Many rotating wafer saw blade structures are known in the art. The present invention is applicable to any saw blade construction, so further structures will not be described herein.

Because semiconductor wafers in the art usually contain a plurality of substantially identical integrated circuits arranged in rows and columns, two sets of mutually parallel streets extending perpendicular to each other over substantially the entire surface of the wafer are formed between each discrete integrated circuit and are sized to allow passage of a wafer saw blade between adjacent integrated circuits without affecting any of their internal circuitry. A typical wafer sawing operation includes attaching the semiconductor wafer to a wafer saw carrier, mechanically, adhesively or otherwise as known in the art, and mounting the wafer saw carrier on the table of the wafer saw. A blade of the wafer saw is passed through the surface of the semiconductor wafer, either by moving the blade relative to the wafer, the table of the saw and the wafer relative to a stationary blade, or a combination of both. To dice the wafer, the blade cuts precisely along each street, returning back over (but not in contact with) the wafer while the wafer is laterally indexed to the next cutting location. Once all cuts associated with mutually parallel streets having one orientation are complete, either the blade is rotated 90° relative to the wafer or the wafer is rotated 90°, and cuts are made through streets in a direction perpendicular to the initial direction of cut. Since each integrated circuit on a conventional wafer has the same size and rectangular configuration, each pass of the wafer saw blade is incrementally indexed one unit (a unit being equal to the distance from one street to the next) in a particular orientation of the wafer. As such, the wafer saw and the software controlling it are designed to provide uniform and precise indexing in fixed increments across the surface of a wafer.

It may, however, be desirable to design and fabricate a semiconductor wafer having various integrated circuits and other semiconductor devices thereon, each of which may be of a different size. For example, in radio-frequency ID (RFID) applications, a battery, chip and antenna could be incorporated into the same wafer such that all semiconductor devices of an RFID electronic device are fabricated from a single semiconductor wafer. Alternatively, memory dice of different capacities, for example, 4, 16 and 64 megabyte DRAMs, might be fabricated on a single wafer to maximize the use of silicon "real estate" and reduce thiefage or waste of material near the periphery of the almost-circular (but for the flat) wafer. Such semiconductor wafers, in order to be diced however, would require modifications to and/or replacement of existing wafer saw hardware and software.

SUMMARY OF THE INVENTION

Accordingly, an apparatus and method for sawing semiconductor wafers, including wafers having a plurality of semiconductor devices of different sizes and/or shapes therein, is provided. In particular, the present invention provides a wafer saw and method of using the same capable of "multiple indexing" of a wafer saw blade or blades to provide the desired cutting capabilities. As used herein, the term "multiple indexing" contemplates and encompasses both the lateral indexing of a saw blade at multiples of a fixed interval and at varying intervals which may not comprise exact multiples of one another. Thus, for conventional wafer configurations containing a number of equally sized integrated circuits, the wafer saw and method herein can substantially simultaneously saw the wafers with multiple blades and therefore cut more quickly than single blade wafer saws known in the art. Moreover, for wafers having a plurality of differently-sized or shaped integrated circuits, the apparatus and method herein provides a multiple indexing capability to cut non-uniform dice from the same wafer.

In a preferred embodiment, a single-blade, multi-indexing saw is provided for cutting a wafer containing variously configured integrated circuits. By providing multiple-indexing capabilities, the wafer saw can sever the wafer into differently sized dice corresponding to the configuration of the integrated circuits contained thereon.

In another preferred embodiment, a wafer saw is provided having at least two wafer saw blades spaced a lateral distance from one another and having their centers of rotation in substantial parallel mutual alignment. The blades are preferably spaced apart a distance equal to the distance between adjacent streets on the wafer in question. With such a saw configuration, multiple parallel cuts through the wafer can be made substantially simultaneously, thus essentially increasing the speed of cutting a wafer by the number of blades utilized in tandem. Because of the small size of the individual integrated circuits and the correspondingly small distances between adjacent streets on the wafer, it may be desirable to space the blades of the wafer saw more than one street apart. For example, if the blades of a two-blade saw are spaced two streets apart, a first pass of the blades would cut the first and third laterally separated streets. A second pass of the blades through the wafer would cut through the second and fourth streets. The blades would then be indexed to cut through the fifth and seventh streets, then sixth and eighth, and so on.

In another preferred embodiment, at least one blade of a multi-blade saw is independently raisable relative to the other blade or blades when only a single cut is desired on a particular pass of the carriage. Such a saw configuration has special utility where the blades are spaced close enough to cut in parallel on either side of larger integrated circuits, but use single blade capability for dicing any smaller integrated circuits. For example, a first pass of the blades of a two blade saw could cut a first set of adjacent streets defining a column of larger integrated circuits of the wafer. One blade could then be independently raised or elevated to effect a subsequent pass of the remaining blade cutting along a street that may be too laterally close to an adjacent street to allow both blades to cut simultaneously, or that merely defines a single column of narrower dice. This feature would also permit parallel scribing of the surface of the wafer to mutually isolate conductors from, for example, tie bars or other common links required during fabrication, with subsequent passage by a single blade indexed to track between the scribe lines to completely sever or singulate the adjacent portions of the wafer.

In yet another preferred embodiment, at least one blade of a multi-blade saw is independently laterally translatable relative to the other blade or blades. Thus, in a two-blade saw, for example, the blades could be laterally adjusted between consecutive saw passes of the sawing operation to accommodate different widths between streets. It should be noted that this preferred embodiment could be combined with other embodiments herein to provide a wafer saw that has blades that are both laterally translatable and independently raisable, or one translatable and one raisable, as desired.

DETAILED DESCRIPTION OF THE INVENTION

Figure 1:
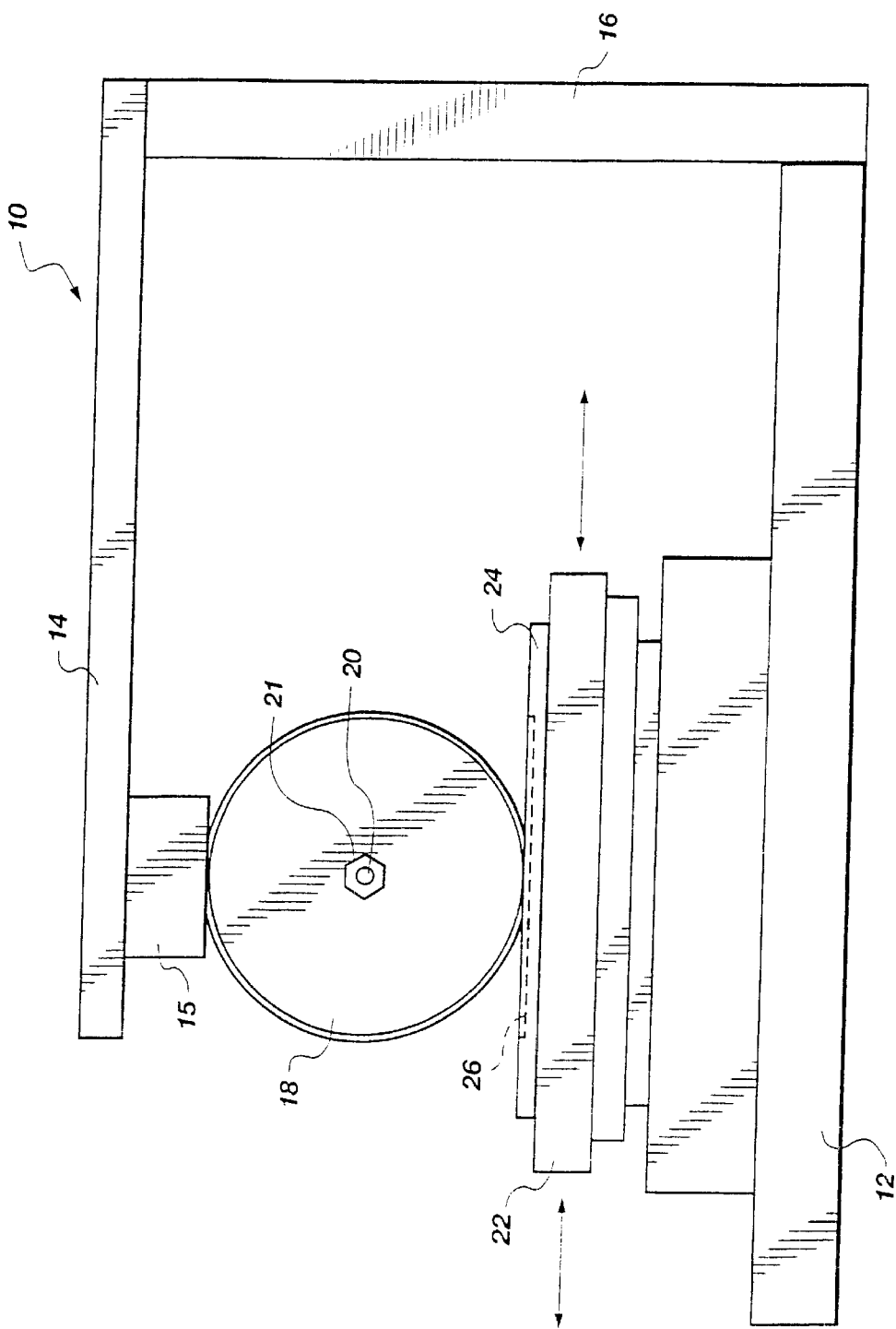
FIG. 1 is a schematic side view of a first preferred embodiment of a wafer saw in accordance with the present invention.
Figure 2:
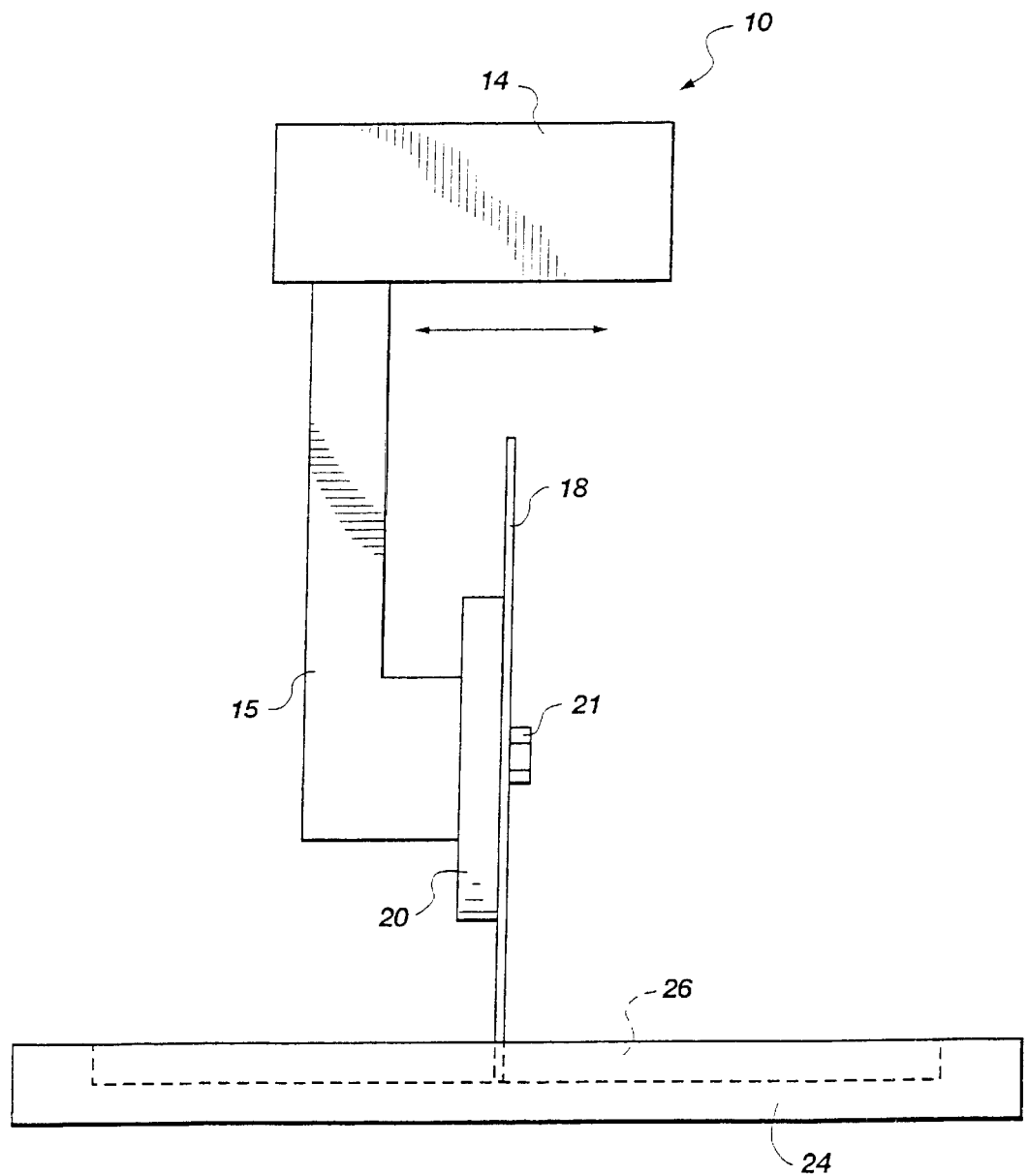
FIG. 2 is a schematic front view of the wafer saw illustrated in FIG. 1.

As illustrated in FIGS. 1 and 2, an exemplary wafer saw 10 according to the invention is comprised of a base 12 to which extension arms 14 and 15 suspended by support 16 are attached. A wafer saw blade 18 is attached to a spindle or hub 20 which is rotatably attached to the extension arm 15. The blade 18 may be secured to the hub 20 and extension arm 15 by a threaded nut 21 or other means of attachment known in the art. The wafer saw 10 also includes a translatable wafer table 22 movably attached in both X and Y directions (as indicated by arrows in FIGS. 1 and 2) to the base 12. Alternatively, blade 18 may be translatable relative to the table 22 to achieve the same relative X-Y movement of the blade 18 to the table 22. A silicon wafer 24 to be scribed or sawed may be securely mounted to the table 22. As used herein, the term "saw" includes scribing of a wafer, the resulting scribe line 26 not completely extending through the wafer substrate. Further, the term "wafer" includes traditional full semiconductor wafers of silicon, gallium arsenide, or indium phosphide and other semiconductor materials, partial wafers, and equivalent structures known in the art wherein a semiconductor material table or substrate is present. For example, so-called silicon-on-insulator or "SOI" structures, wherein silicon is carried on a glass, ceramic or sapphire ("SOS" ) base, or other such structures as known in the art, are encompassed by the term "wafer" as used herein. Likewise, "semiconductor substrate" may be used to identify wafers and other structures to be singulated into smaller elements.

The saw 10 is capable of lateral multi-indexing of the table 22 or blade 18 or, in other words, translatable from side-to-side in FIG. 2 and into and out of the plane of the page in FIG. 1 various non-uniform distances. As noted before, such non-uniform distances may be mere multiples of a unit distance, or may comprise unrelated varying distances, as desired. Accordingly, a wafer 24 having variously sized integrated circuits or other devices or components therein may be sectioned or diced into its non-uniformly sized components by the multi-indexing wafer saw 10. In addition, as previously alluded, the saw 10 may be used to create scribe lines or cuts that do not extend through the wafer 24. The wafer 24 can then subsequently be diced by other methods known in the art or sawed completely through after the blade 18 has been lowered to traverse the wafer to its full depth or thickness.

Before proceeding further, it will be understood and appreciated that design and fabrication of a wafer saw according to the invention having the previously-referenced, multi-indexing capabilities, independent lateral blade translation and independent blade raising or elevation are within the ability of one of ordinary skill in the art, and that likewise the control of such a device to effect the multiple-indexing (whether in units of fixed increments or otherwise), lateral blade translation and blade elevation may be effected by suitable programming of the software-controlled operating system, as known in the art. Accordingly, no further description of hardware components or of a control system to effectuate operation of the apparatus of the invention is necessary.

Figure 3:
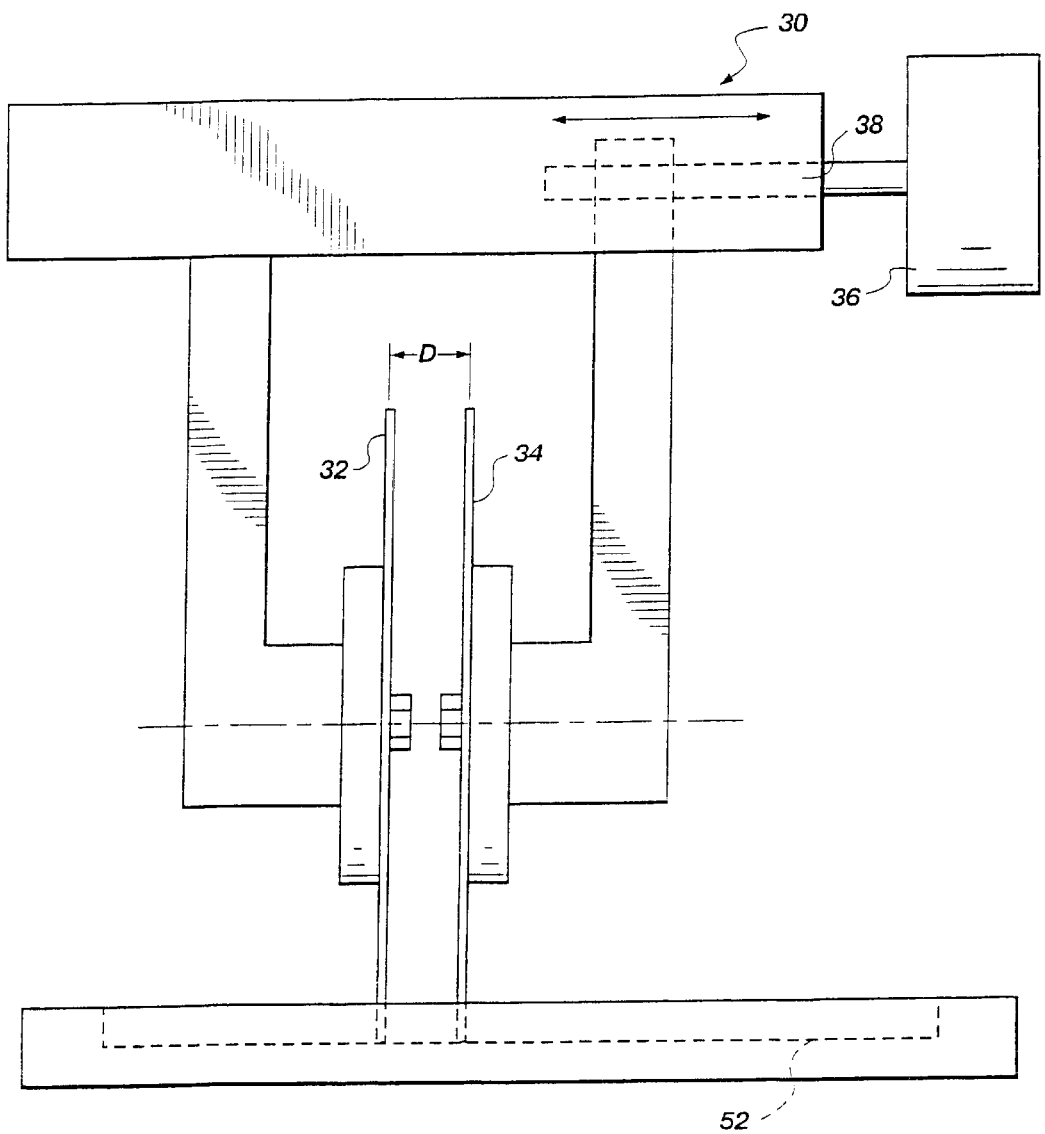
FIG. 3 is a schematic front view of a second embodiment of a wafer saw in accordance with the present invention.
Figure 4:
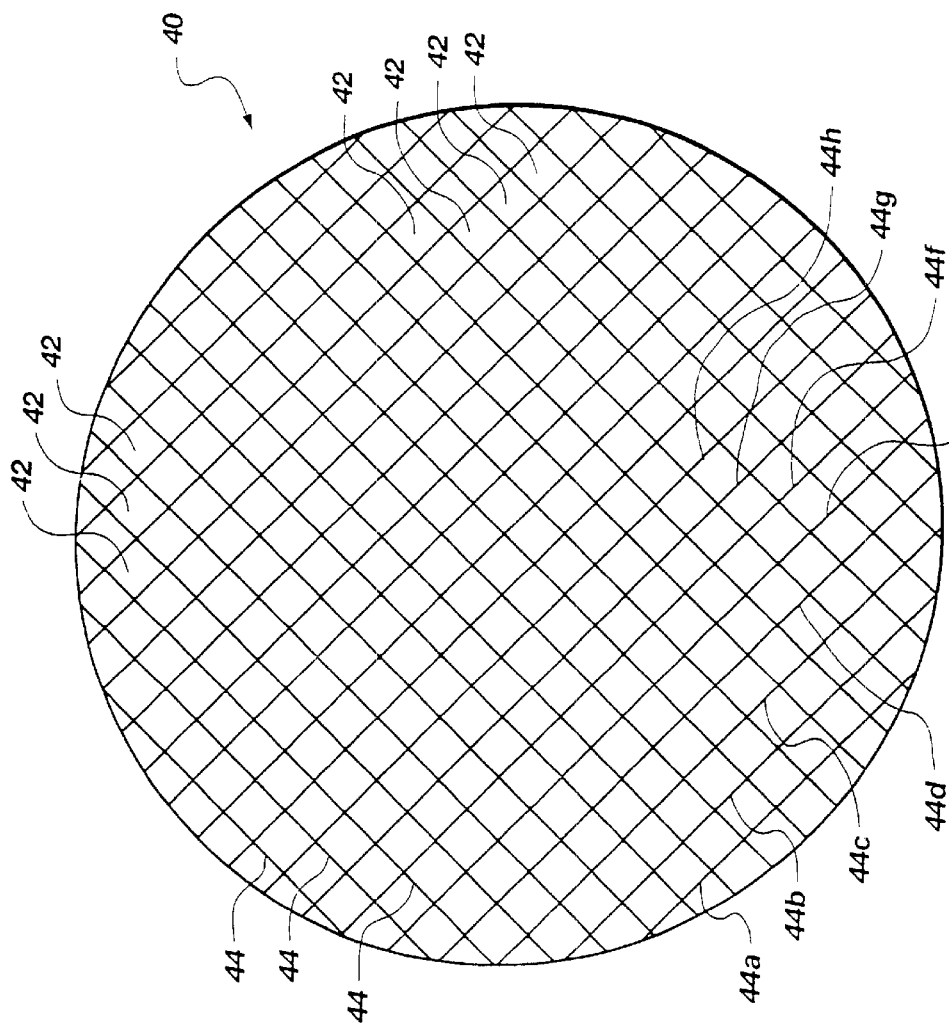
FIG. 4 is a schematic view of a first silicon semiconductor wafer having a conventional configuration to be diced with the wafer saw of the present invention.
Figure 5:
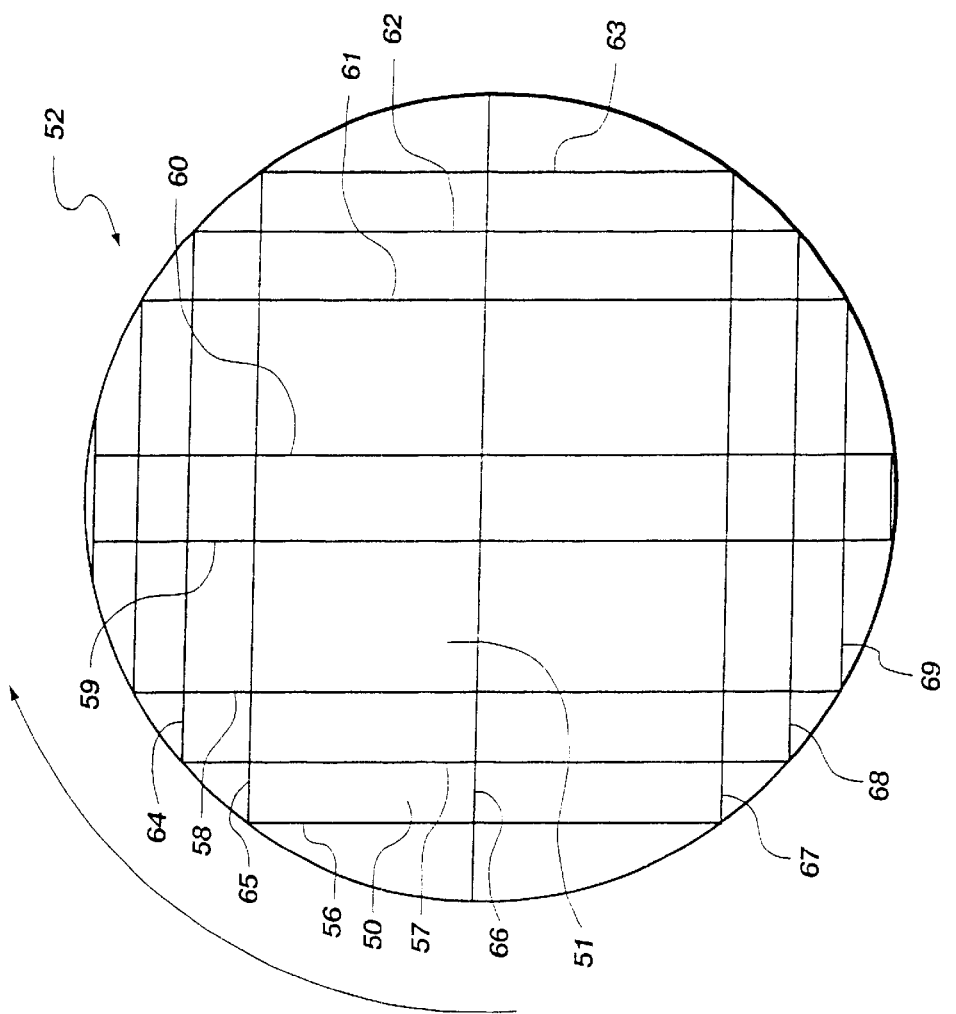
FIG. 5 is a schematic view of a second silicon semiconductor wafer having variously sized semiconductor devices therein to be diced with the wafer saw of the present invention.

Referring now to FIG. 3, another illustrated embodiment of a wafer saw 30 is shown having two laterally-spaced blades 32 and 34 with their centers of rotation in substantial parallel alignment transverse to the planes of the blades. For a conventional, substantially circular silicon semiconductor wafer 40 (flat omitted), as illustrated in FIG. 4, having a plurality of similarly configured integrated circuits 42 arranged in evenly spaced rows and columns, the blades can be spaced a distance D substantially equal to the distance between adjacent streets 44 defining the space between each integrated circuit 42. In addition, if the streets 44 of wafer 40 are too closely spaced for side-by-side blades 32 and 34 to cut along adjacent streets, the blades 32 and 34 can be spaced a distance D substantially equal to the distance between two or more streets. For example, a first pass of the blades 32 and 34 could cut along streets 44a and 44c and a second pass along streets 44b and 44d. The blades could then be indexed to cut the next series of streets and the process repeated for streets 44e, 44f, 44g, and 44h. If, however, the integrated circuits of a wafer 52 have various sizes, such as integrated circuits 50 and 51 as illustrated in FIG. 5, at least one blade 34 is laterally translatable relative to the other blade 32 to cut along the streets, such as street 56, separating the variously sized integrated circuits 50. The blade 34 may be variously translatable by a stepper motor 36 having a lead screw 38 or by other devices known in the art, such as high precision gearing in combination with an electric motor or hydraulics, or other suitable mechanical drive and control assemblies. For a wafer 52, the integrated circuits, such as integrated circuits 50 and 51, may be diced by setting the blades 32 and 34 to simultaneously cut along streets 56 and 57, indexing the blades, setting them to a wider lateral spread and cutting along streets 58 and 59, indexing the blades while monitoring the same lateral spread or separation and cutting along streets 60 and 61, and then narrowing the blade spacing and indexing the blades and cutting along streets 62 and 63. The wafer 52 could then be rotated 90°, as illustrated by the arrow in FIG. 5, and the blade separation and indexing process repeated for streets 64 and 65, streets 66 and 67, and streets 68 and 69.

Figure 6:
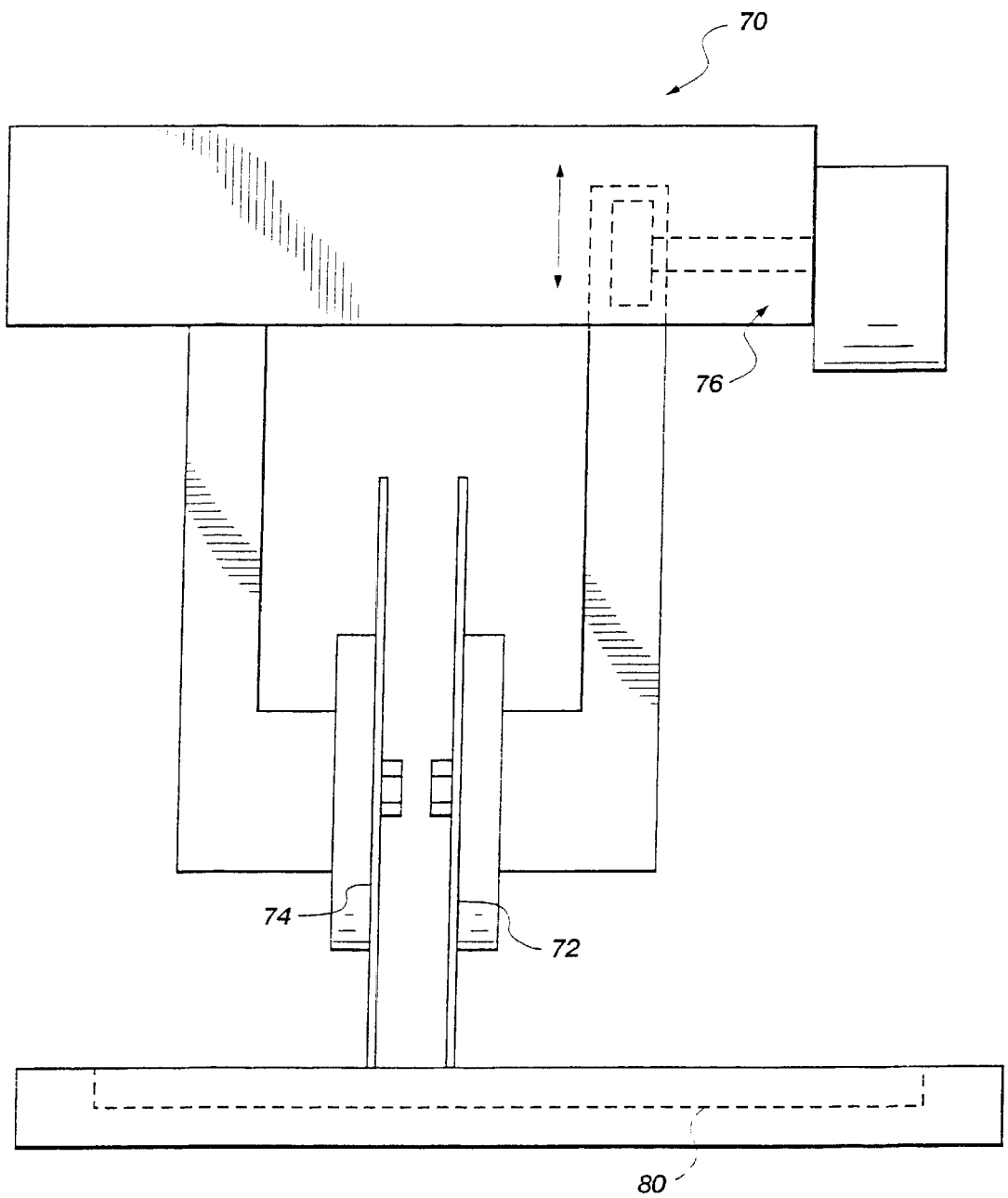
FIG. 6 is a schematic front view of a third embodiment of a wafer saw in accordance with the present invention.
Figure 7:
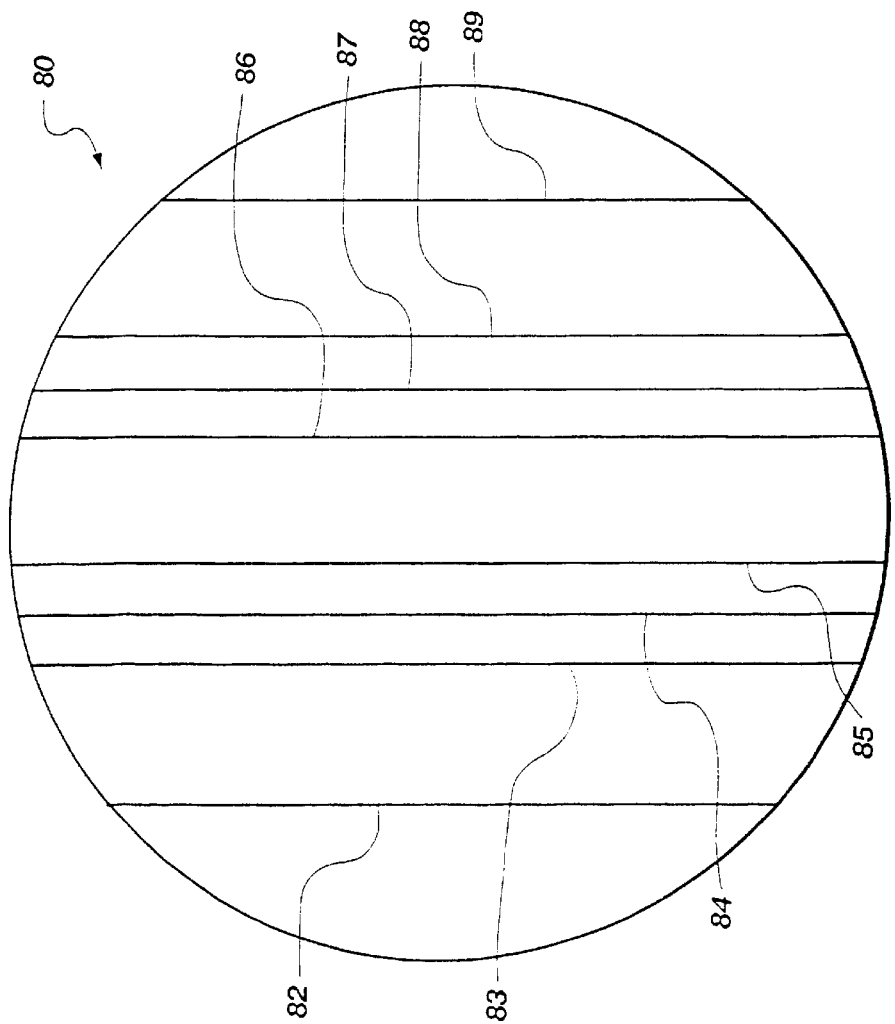
FIG. 7 is a schematic view of a third silicon semiconductor wafer having variously sized semiconductor devices therein to be diced with the wafer saw of the present invention.

As illustrated in FIG. 6, a wafer saw 70 according to the present invention is shown having two blades 72 and 74, one of which is independently raisable (as indicated by an arrow) relative to the other. As used herein, the term "raisable" includes vertical translation either up or down. Such a configuration may be beneficial for situations where the distance between adjacent streets is less than the minimum lateral achievable distance between blades 72 and 74, or only a single column of narrow dice is to be cut, such as at the edge of a wafer. Thus, when cutting a wafer 80, as better illustrated in FIG. 7, the two blades 72 and 74 can make a first pass along streets 82 and 83. One blade 72 can then be raised, the wafer 80 indexed relative to the unraised blade 74 and a second pass performed along street 84 only. Blade 72 can then be lowered and the wafer 80 indexed for cutting along streets 85 and 86. The process can be repeated for streets 87 (single-blade pass), 88, and 89 (double-blade pass). The elevation mechanism 76 for blade 72 may comprise a stepper motor, a precision-geared hydraulic or electric mechanism, a pivotable arm which is electrically, hydraulically or pneumatically powered, or other means well known in the art.

Finally, it may be desirable to combine the lateral translation feature of the embodiment of the wafer saw 30 illustrated in FIG. 3 with the independent blade raising feature of the wafer saw 70 of FIG. 6. Such a wafer saw could use a single blade to cut along streets that are too closely spaced for dual-blade cutting or in other suitable situations, and use both blades to cut along variously spaced streets where the lateral distance between adjacent streets is sufficient for both blades to be engaged.

It will be appreciated by those skilled in the art that the embodiments herein described while illustrating certain embodiments are not intended to so limit the invention or the scope of the appended claims. More specifically, this invention, while being described with reference to semiconductor wafers containing integrated circuits or other semiconductor devices, has equal utility to any type of substrate to be scribed or singulated. For example, fabrication of test inserts or chip carriers formed from a silicon (or other semiconductor) wafer and used to make temporary or permanent chip-to-wafer, chip-to-chip and chip-to-carrier interconnections and that are cut into individual or groups of inserts, as described in U.S. Pat. Nos. 5,326,428 and 4,937,653, may benefit from the multi-indexing method and apparatus described herein.

Figure 8:
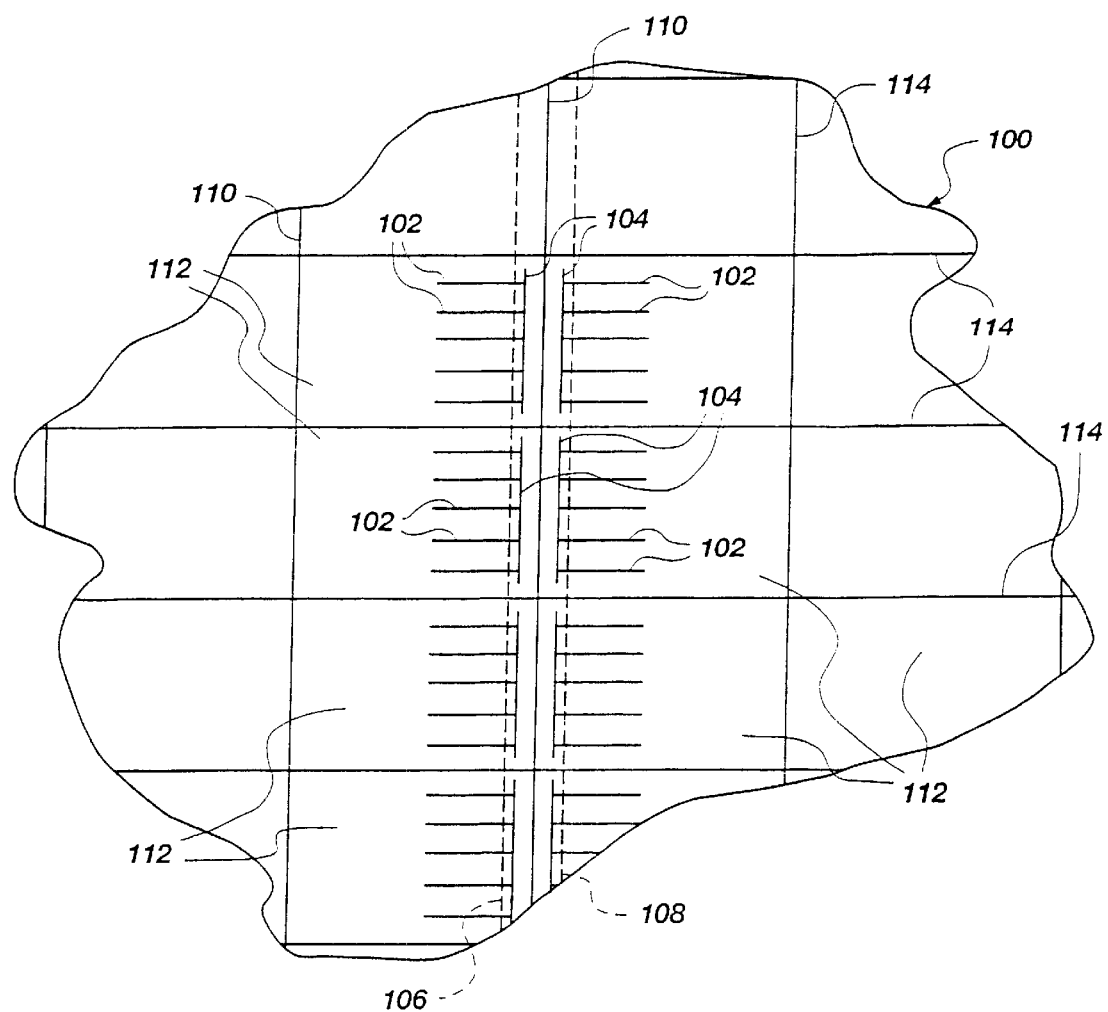
FIG. 8 is a top elevation of a portion of a semiconductor substrate bearing conductive traces connected by tie bars.

For example, illustrated in FIG. 8, a semiconductor substrate 100 may have traces 102 formed thereon by electrodeposition techniques requiring connection of a plurality of traces 102 through a tie bar 104. A two-blade saw in accordance with the present invention may be employed to simultaneously scribe substrate 100 along parallel lines 106 and 108 flanking a street 110 in order to sever tie bars 104 of adjacent substrate segments 112 from their associated traces 102. Following such severance, the two columns of adjacent substrate segments 112 (corresponding to what would be termed "dice" if integrated circuits were formed thereon) are completely severed along street 110 after the two-blade saw is indexed for alignment of one blade therewith, and the other blade raised out of contact with substrate 100. Subsequently, when either the saw or the substrate carrier is rotated 90°, singulation of the segments 112 is completed along mutually parallel streets 114. Thus, substrate segments 112 for test or packaging purposes may be fabricated more efficiently in the same manner as dice and in the same sizes and shapes.

Further, and as previously noted, RFID modules may be more easily fabricated when all components of a module are formed on a single wafer and retrieved therefrom for placement on a carrier substrate providing mechanical support and electrical interconnection between components.

Figure 9:
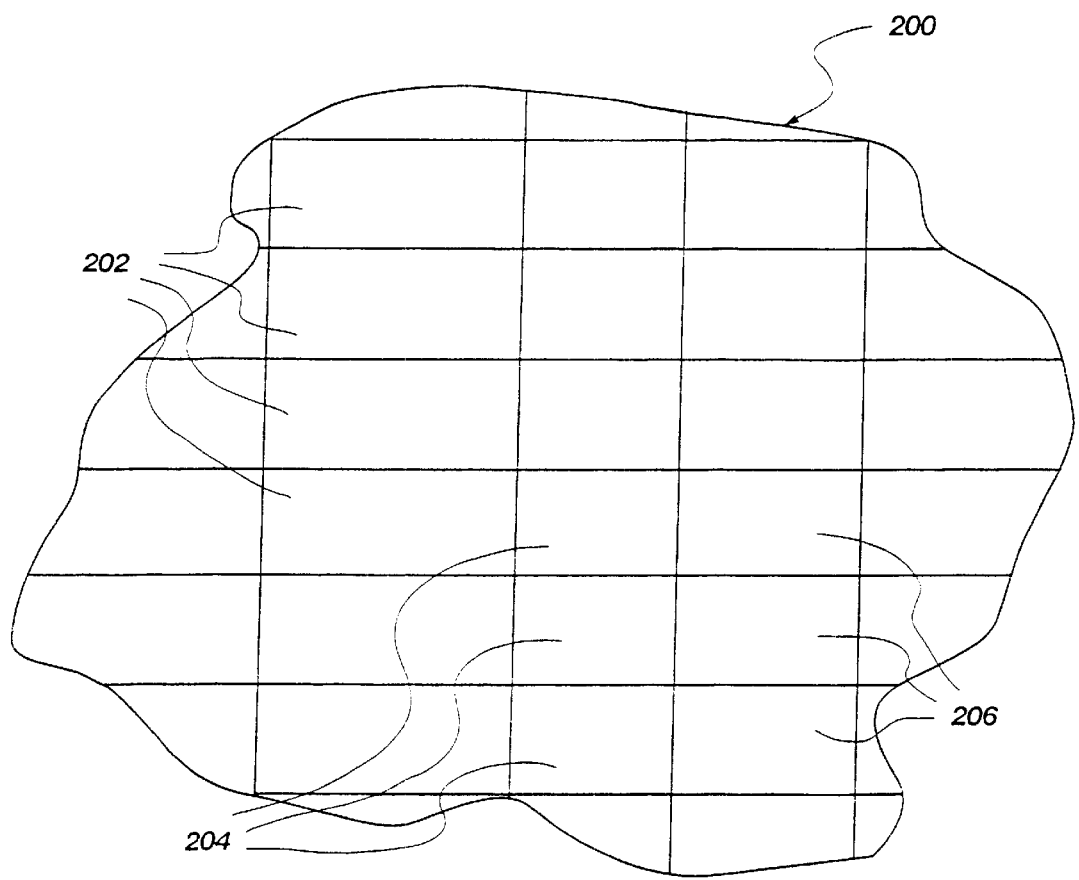
FIG. 9 is a top elevation of a portion of a semiconductor substrate bearing three different types of components formed thereon.

As shown in FIG. 9, a portion of a substrate 200 is depicted with three adjacent columns of varying-width segments, the three widths of segments illustrating batteries 202, chips 204 and antennas 206 of an RFID device. With all of the RFID components formed on a single substrate 200, an RFID module may be assembled by a single pick-and-place apparatus at a single work station. Thus, complete modules may be assembled without transfer of partially-assembled modules from one station to the next to add components. Of course, this approach may be employed to any module assembly wherein all of the components are capable of being fabricated on a single semiconductor substrate. Fabrication of different components by semiconductor device fabrication techniques known in the art is within the ability of those of ordinary skill in the art, and therefore no detailed explanation of the fabrication process leading to the presence of different components on a common wafer or other substrate is necessary. Masking of semiconductor device elements not involved in a particular process step is widely practiced, and so similar isolation of entire components is also easily effected to protect the elements of a component until the next process step with which it is involved.

Further, the present invention has particular applicability to the fabrication of custom or non-standard IC's or other components, wherein a capability for rapid and easy die size and shape adjustment on a wafer-by-wafer basis is highly beneficial and cost-effective. Those skilled in the art will also understand that various combinations of the preferred embodiments could be made without departing from the spirit of the invention. For example, it may be desirable to have at least one blade of the independently laterally translatable blade configuration be independently raisable relative to the other blade or blades, or a single blade may be both translatable and raisable relative to one or more other blades and to the target wafer. In addition, while for purposes of simplicity some of the preferred embodiments of the wafer saw are illustrated as having two blades, those skilled in the art will appreciate that the scope of the invention and appended claims is intended to cover wafer saws having more or less than two blades. Thus, while certain representative embodiments and details have been shown for purposes of illustrating the invention, it will be apparent to those skilled in the art that various changes in the invention disclosed herein may be made without departing from the scope of the invention, which is defined in the appended claims.

What is claimed is:

1. A method for forming individual electronic devices with conductive traces, comprising:
    providing a substrate comprising a plurality of columns of electronic components, each adjacent pair of columns of said plurality of columns being separated from one another by a street located therebetween;
    forming groups of conductive traces on a surface of said substrate, at least two groups of said groups of conductive traces extending at least partially over adjacent electronic components, said at least two groups of conductive traces being connected to one another and extending at least partially over said street between said adjacent electronic components;
    substantially concurrently severing said at least two groups of conductive traces from one another; and
    severing said adjacent electronic components along said street.

2. The method of claim 1, wherein at least some of said electronic components comprise semiconductor devices.

3. The method of claim 1, wherein said substantially concurrently severing is effected by cutting through said at least two groups of conductive traces.

4. The method of claim 3, wherein said substantially concurrently severing comprises cutting at least partially through said substrate.

5. The method of claim 4, wherein said cutting at least partially through said substrate comprises scribing said surface of said substrate.

6. The method of claim 1, wherein said forming groups of conductive traces comprises positioning preformed conductive traces on said surface of said substrate.

7. The method of claim 6, wherein said positioning comprises positioning at least one plurality of conductive traces held together with at least one tie bar on said surface of said substrate.

8. The method of claim 7, wherein said substantially concurrently severing is effected substantially concurrently with severing said at least one tie bar from said at least one plurality of conductive traces.

9. The method of claim 1, wherein said substantially concurrently severing is effected with a wafer saw.

10. The method of claim 9, wherein said substantially concurrently severing is effected with said wafer saw including at least two parallel saw blades.

11. The method of claim 10, wherein said substantially concurrently severing is effected by laterally moving at least one of said at least two parallel saw blades to a position aligned with said street and raising the other of said at least two parallel saw blades out of contact with said substrate.

12. The method of claim 1, wherein said forming groups of conductive traces comprises depositing material of said groups of conductive traces on said substrate.

13. A method for forming electronic components with conductive traces, comprising:
    providing a substrate comprising a plurality of columns, each column of said plurality of columns including at least one electronic component, adjacent columns of said plurality of columns being separated from one another by a street;
    positioning groups of conductive traces on a surface of said substrate, at least two groups of said groups of conductive traces extending at least partially over different, adjacent electronic components, said at least two groups of conductive traces being connected to one another and extending at least partially over said street between said adjacent electronic components;
    severing said at least two groups of conductive traces from one another; and
    severing said adjacent electronic components along said street.

14. The method of claim 13, wherein at least one electronic component of said substrate comprises a semiconductor device.

15. The method of claim 13, wherein said positioning comprises depositing material of said groups of conductive traces.

16. The method of claim 15, wherein said depositing comprises electrodeposition.

17. The method of claim 13, wherein said severing said at least two groups of conductive traces and said severing said adjacent electronic components are effected substantially concurrently.

18. The method of claim 13, further comprising severing a tie bar connecting at least one group of conductive traces from said at least one group of conductive traces.

19. The method of claim 18, wherein said severing said adjacent electronic components and said severing said tie bar are effected substantially concurrently.

20. A method for forming at least one semiconductor device component with conductive traces, comprising:
    providing a substrate comprising a plurality of columns, each column of said plurality of columns including at least one electronic component, adjacent columns of said plurality of columns being separated from one another by a street;
    positioning groups of conductive traces on a surface of said substrate, at least one group of said groups of conductive traces extending at least partially over the at least one electronic component, at least another group of said groups of conductive traces extending at least partially over an electronic component adjacent to the at least one electronic component, said at least one group and said at least another group being connected to one another and extending at least partially over said street between said adjacent columns;
    severing at least two groups of conductive traces from one another; and
    severing the at least one electronic component and said electronic component adjacent thereto along said street.

* * * * *